United States Patent
Lim et al.

(10) Patent No.: US 8,377,265 B2
(45) Date of Patent: Feb. 19, 2013

(54) METHOD OF FORMING INORGANIC INSULATING LAYER AND METHOD OF FABRICATING ARRAY SUBSTRATE FOR DISPLAY DEVICE USING THE SAME

(75) Inventors: Joo-Soo Lim, Gumi-si (KR); Hong-Sik Kim, Seoul (KR); Hee-Young Kwack, Seoul (KR); Hyun-Seok Hong, Goyang-si (KR); Byung-Chul Ahn, Seoul (KR); Byoung-Ho Lim, Gumi-Si (KR)

(73) Assignee: LG Display Co., Ltd., Seoul (KR)

( * ) Notice: Subject to any disclaimer, the term of this patent is extended or adjusted under 35 U.S.C. 154(b) by 242 days.

(21) Appl. No.: 11/967,660

(22) Filed: Dec. 31, 2007

(65) Prior Publication Data
US 2009/0023254 A1    Jan. 22, 2009

(30) Foreign Application Priority Data
Jul. 20, 2007 (KR) .................. 10-2007-0073045

(51) Int. Cl.
*C23C 14/35* (2006.01)
(52) U.S. Cl. .................................. 204/192.23
(58) Field of Classification Search ............. 204/192.23
See application file for complete search history.

(56) References Cited

U.S. PATENT DOCUMENTS

| | | | | |
|---|---|---|---|---|
| 4,978,437 | A * | 12/1990 | Wirz | 204/192.23 |
| 5,047,131 | A * | 9/1991 | Wolfe et al. | 204/192.23 |
| 5,091,267 | A * | 2/1992 | Asano et al. | 428/824.4 |
| 5,320,984 | A * | 6/1994 | Zhang et al. | 438/488 |
| 5,322,605 | A * | 6/1994 | Yamanishi | 204/298.07 |
| 5,403,458 | A * | 4/1995 | Hartig et al. | 204/192.15 |
| 5,550,091 | A * | 8/1996 | Fukuda et al. | 204/192.23 |
| 6,468,403 | B1 * | 10/2002 | Shimizu et al. | 204/192.29 |
| 2003/0034497 | A1* | 2/2003 | Yamazaki et al. | 257/86 |
| 2006/0032739 | A1* | 2/2006 | Ikeda et al. | 204/192.23 |
| 2006/0272938 | A1* | 12/2006 | Kuan et al. | 204/192.15 |

FOREIGN PATENT DOCUMENTS
CN 1996415 A 7/2007
JP 2003-201559 * 7/2003

OTHER PUBLICATIONS

Machine Translation JP 2003-201559 dated Jul. 2003.*
Office Action issued in corresponding Chinese Patent Application No. 2007103058979, mailed Apr. 13, 2011.

* cited by examiner

*Primary Examiner* — Rodney McDonald
(74) *Attorney, Agent, or Firm* — Brinks Hofer Gilson & Lione

(57) ABSTRACT

A method of forming an inorganic insulating layer on a substrate comprises supplying a mixed gas between the substrate and a target, and generating a plasma between the substrate and the target. The target comprises a silicon-based material. The method further comprises depositing a plurality of ions from the plasma on the substrate.

14 Claims, 13 Drawing Sheets

METHOD OF FORMING INORGANIC INSULATING LAYER AND METHOD OF FABRICATING ARRAY SUBSTRATE FOR DISPLAY DEVICE USING THE SAME

CLAIM FOR PRIORITY

This application claims the benefit of Korean Patent Application No. 2007-0073045, filed Jul. 20, 2007, which is hereby incorporated by reference in its entirety.

TECHNICAL FIELD

The present invention relates to a method of forming an inorganic insulating layer, and more particularly, to a method of fabricating an array substrate for a display device using the same.

BACKGROUND

Until recently, display devices have typically used cathode-ray tubes (CRTs). More recently, considerable effort has been expanded to research and develop thin film transistor liquid crystal display (TFT-LCD) devices having thin profiles, light weight and low power consumption as substitutes for CRTs.

Liquid crystal display (LCD) devices use the optical anisotropy and polarization properties of liquid crystal molecules of a liquid crystal layer to produce an image. The liquid crystal molecules have long and thin shapes. Because of the optical anisotropy property, the polarization of light varies with the alignment direction of the liquid crystal molecules. The alignment direction of the liquid crystal molecules can be controlled by varying the intensity of an electric field applied to the liquid crystal layer. Accordingly, a typical LCD device includes two substrates spaced apart and facing each other and a liquid crystal layer interposed between the two substrates. Each of the two substrates includes an electrode on a surface facing the other of the two substrates. A voltage is applied to each electrode to induce an electric field between the electrodes. The arrangement of the liquid crystal molecules as well as the transmittance of light through the liquid crystal layer is controlled by varying the intensity of the electric field. LCD devices are non-emissive type display devices that employ a light source to display images using the change in light transmittance.

Among the various types of LCD devices, active matrix LCD (AM-LCD) devices that employ switching elements and pixel electrodes arranged in a matrix structure are the subject of significant research and development because of their high resolution and superior suitability for displaying moving images. Thin film transistor LCD (TFT-LCD) devices use thin film transistors (TFTs) as the switching elements.

FIG. 1 is a perspective view of an LCD device according to the related art. As shown in FIG. 1, the LCD device of the related art includes a first substrate 10, a second substrate 20 and a liquid crystal layer 30. The first substrate 10 is referred to as an array substrate and includes a gate line 14 and a data line 16 crossing each other to define a pixel region P. A pixel electrode 18 and a thin film transistor (TFT) Tr, as a switching element, are positioned in each pixel region P. Thin film transistors Tr, which are disposed adjacent to crossings of the gate lines 14 and the data lines 16 are disposed in a matrix on the first substrate 10. The second substrate 20 is referred to as a color filter substrate, and includes color filter layer 26 including red (R), green (G) and blue (B) color filters 26a, 26b and 26c, a black matrix 25 between the red, green and blue color filters 26a, 26b and 26c and a common electrode 28 on both the color filter layer 26 and the black matrix 25.

Although not shown in FIG. 1, the first and second substrates 10 and 20 are attached with a seal pattern to prevent leakage of liquid crystal layer 30. In addition, a first alignment layer is formed between the first substrate 10 and the liquid crystal layer 30 and a second alignment layer is formed between the second substrate 20 and the liquid crystal layer 30 to align the liquid crystal molecules in the liquid crystal layer 30 along an initial alignment direction. A polarization plate is formed on an outer surface of at least one of the first and second substrates 10 and 20.

Further, a backlight unit (not shown) disposed under the first substrate 10 supplies light. A gate signal turning the TFT Tr on is sequentially applied to each of the gate lines 14, and an image signal on the data line 16 is applied to the pixel electrode 18 in the pixel region P. The liquid crystal molecules in the liquid crystal layer 30 are driven by a vertical electric field generated between the pixel electrode 18 and the common electrode 28 to display images by varying the light transmittance of the liquid crystal molecules.

In the above related art LCD device, elements of a metallic material such as the gate line 14, the gate electrode (not shown), the data line 16, the source electrode (not shown), the drain electrode (not shown) and the pixel electrode 18 may be formed through a physical vapor deposition (PVD) method such as a sputtering. Elements of an inorganic insulating material or a semiconductor material such as the gate insulating layer (not shown), the passivation layer (not shown) and a semiconductor layer may be formed through a chemical vapor deposition (CVD) method. In addition, the CVD method requires a temperature higher than about 300° C. Since a glass substrate having a transition temperature of about 600° C. is used as the first and second substrates 10 and 20 in the related art LCD device, the elements through the CVD method or the PVD method may be formed on the first and second substrates 10 and 20 without any problems.

Recently, however, as a portable terminal having a small size such as a notebook and a personal digital assistant (PDA) is widely used, an LCD device having light weight and flexibility is required for applying to the portable terminal. As a result, an LCD device including first and second substrates formed of transparent plastic has been researched and developed. However, since plastic is inferior to glass in thermal resistance and chemical resistance, a plastic substrate has disadvantages in a fabrication process for an LCD device including a high temperature process over about 200° C., specifically, in a fabrication process for an array substrate having a TFT. For example, when an inorganic insulating layer and a semiconductor layer are formed on a substrate through a CVD method, a maximum temperature may be at least 300° C. Accordingly, the plastic substrate may be deformed or degraded, and there exist many problems in production of an LCD device having a plastic substrate. Further, a produced LCD device having a plastic substrate may have a poor display quality due to the deformation or degradation of the substrate.

Although an organic semiconductor material which can be coated on a substrate at room temperature has been researched for the semiconductor layer, the inorganic insulating layer is still formed through a CVD method. The inorganic insulating layer formed through a CVD method causes deformation or degradation of a plastic substrate.

SUMMARY

In another aspect, a method of forming an inorganic insulating layer on a substrate comprises supplying a mixed gas between the substrate and a target, and generating a plasma between the substrate and the target. The target comprises a silicon-based material. The method further comprises depositing a plurality of ions from the plasma on the substrate.

In another aspect, a method of forming a passive pattern on a substrate comprises forming an active layer, a data line, a source electrode and a drain electrode on the substrate. The active layer is disposed over the gate electrode. The source and drain electrodes are spaced apart from each other to expose the active layer. The method further comprises forming a passivation layer on the substrate by sputtering under a temperature of about 24° C. to about 250° C., and forming a passivation pattern on the active layer between the source electrode and the drain electrode from the passivation layer.

In yet another aspect, a method of forming a substrate that has a passivation pattern comprises forming a gate line and a gate electrode connected to the gate line on a substrate, forming a gate insulating layer on the gate line and the gate electrode, and forming an active layer, a data line, a source electrode and a drain electrode on the gate insulating layer. The active layer is disposed over the gate electrode. The source and drain electrodes are spaced apart from each other to expose the active layer. The method further comprises forming a pixel electrode that contacts the drain electrode and a connection electrode that connects the data line and the source electrode, and forming a passivation pattern, which includes an inorganic insulating layer, on the active layer between the source and drain region by sputtering.

BRIEF DESCRIPTION OF THE DRAWINGS

The accompanying drawings, which are included to provide a further understanding of the invention and are incorporated in and constitute a part of this specification, illustrate embodiments of the invention.

DETAILED DESCRIPTION

Reference will now be made in detail to embodiments which are illustrated in the accompanying drawings. Wherever possible, similar reference numbers will be used to refer to the same or similar parts.

Figure 1:
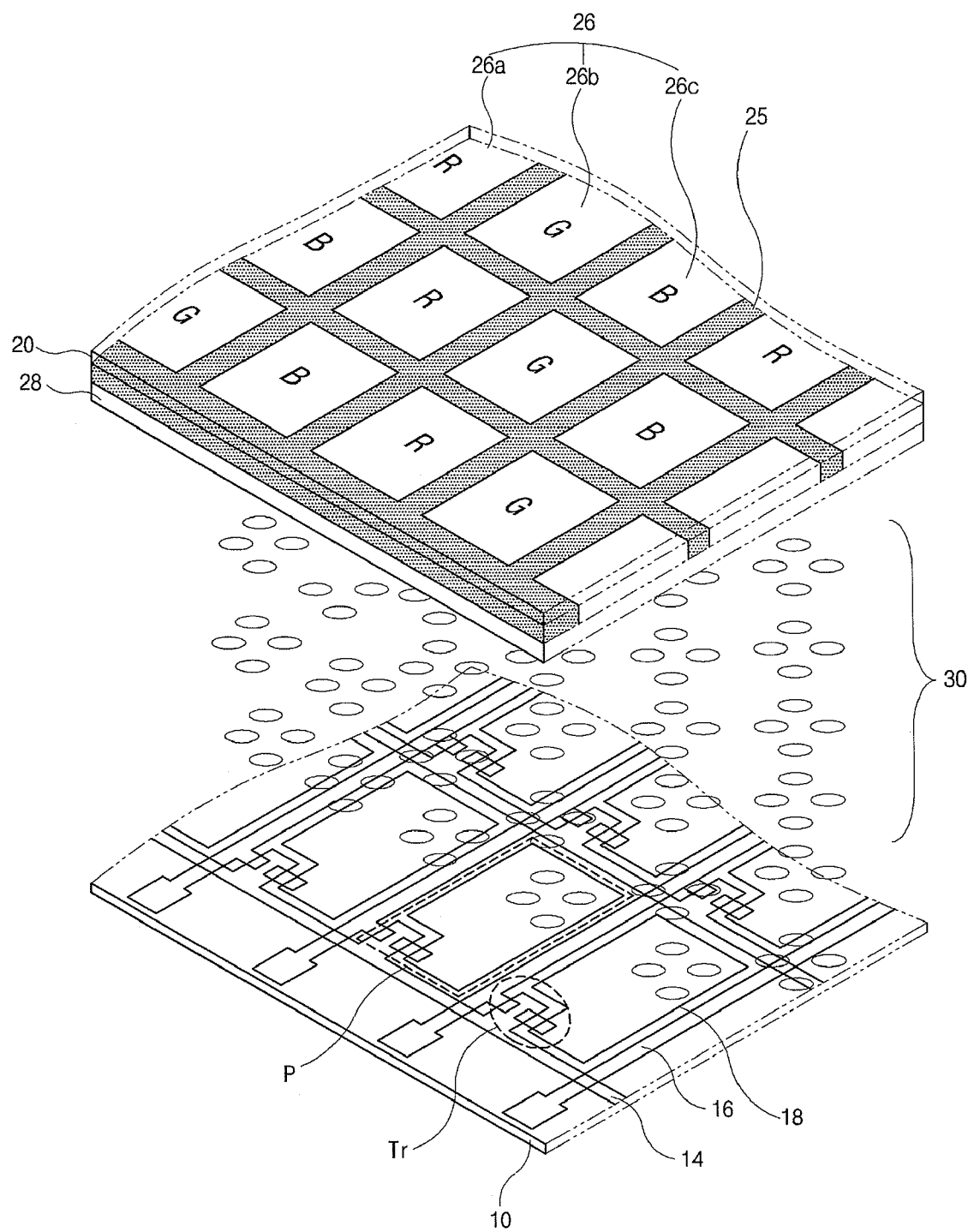
FIG. 1 is a perspective view of an LCD device according to the related art.
Figure 2A:
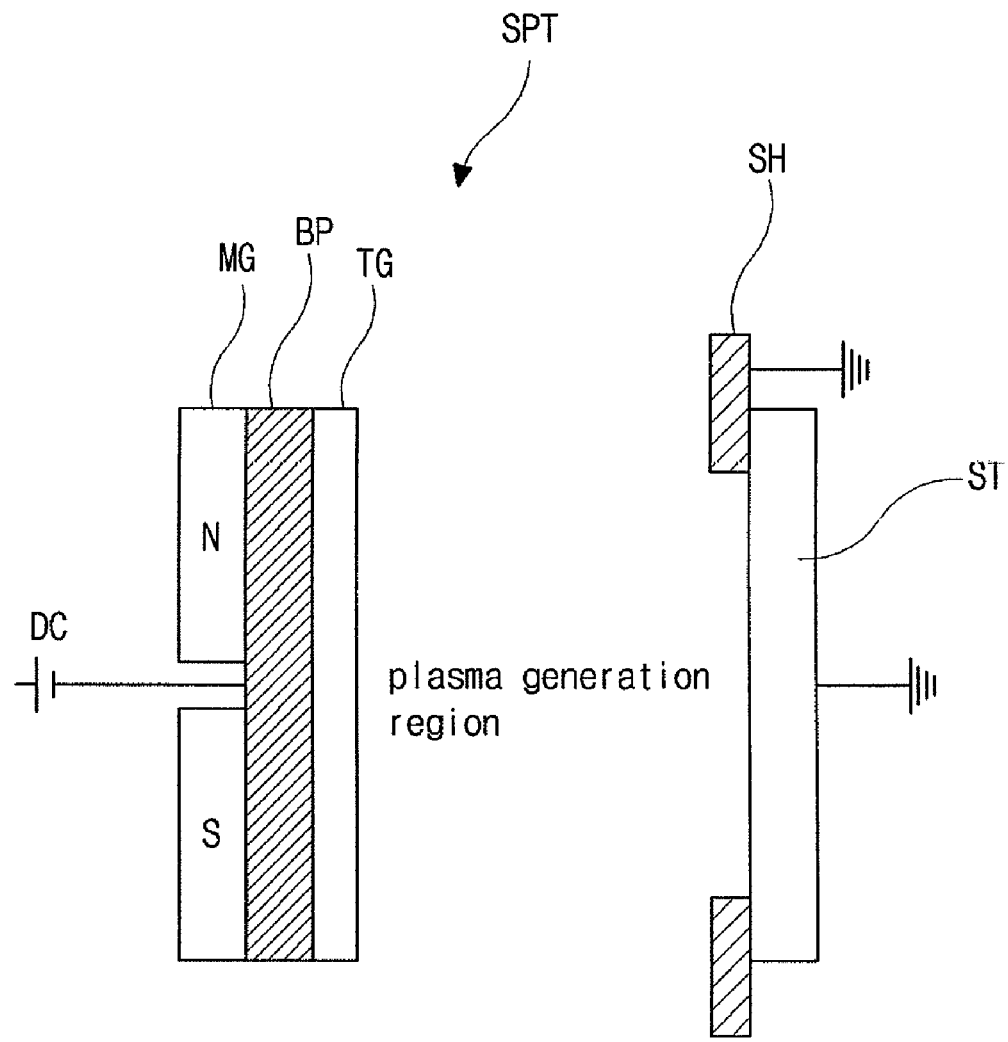
FIGS. 2A, 2B and 2C are schematic cross-sectional views illustrating a method of forming an inorganic insulating layer by a direct current sputtering, an alternating current sputtering and a radio frequency sputtering, respectively, according to an embodiment of the present invention.
Figure 2B:
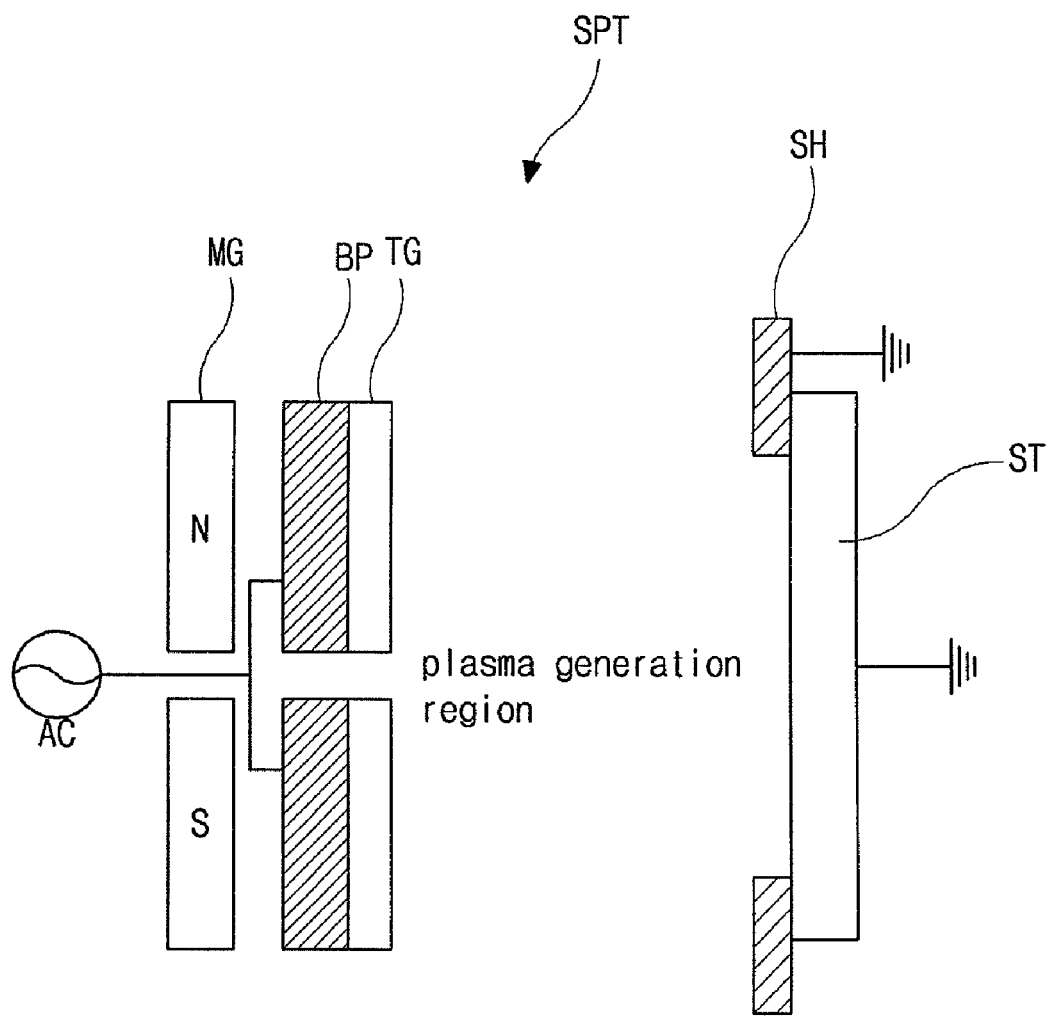
Figure 2C:
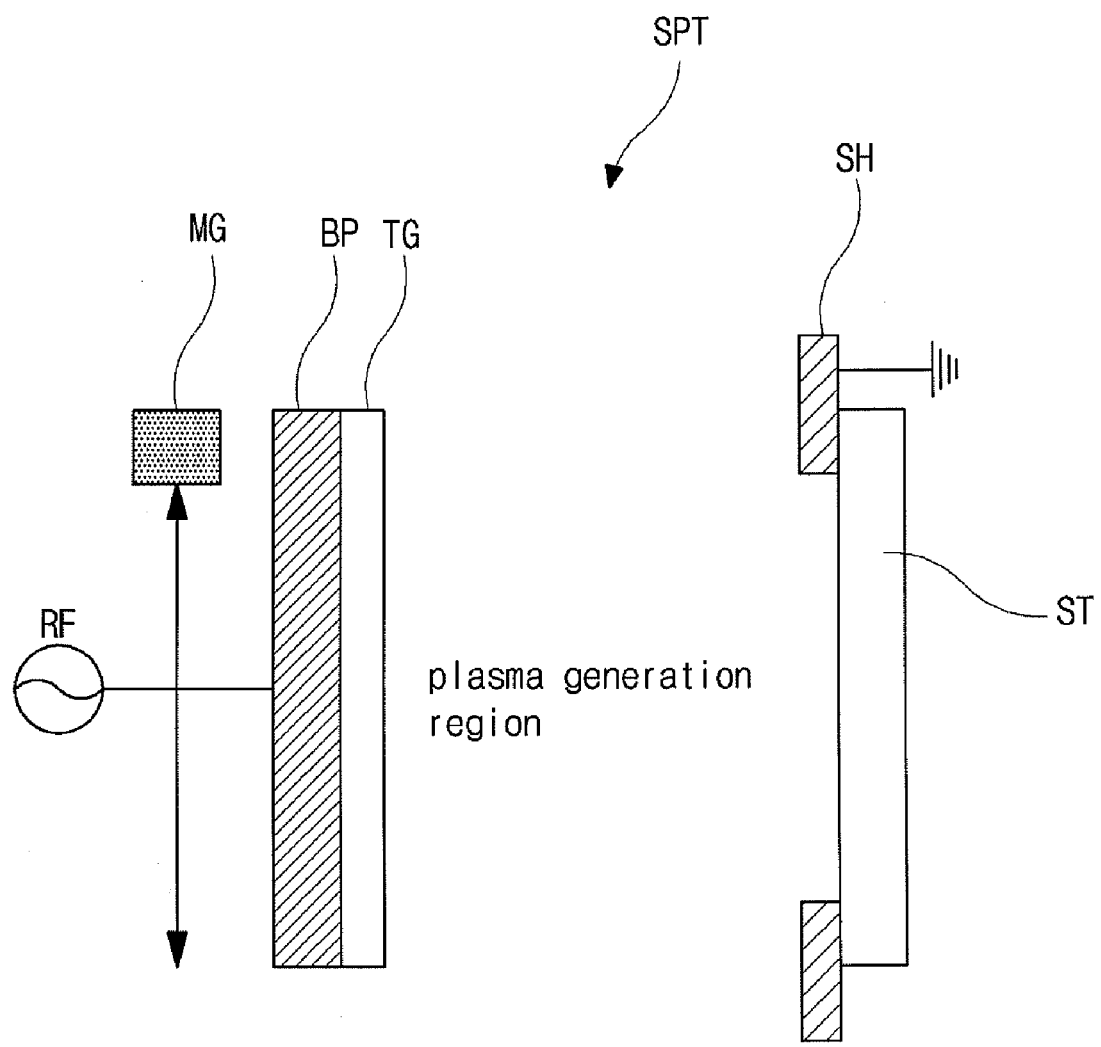

FIGS. 2A, 2B and 2C are schematic cross-sectional views illustrating a method of forming an inorganic insulating layer by a direct current sputtering, an alternating current sputtering and a radio frequency sputtering, respectively, according to an embodiment of the present invention.

In FIGS. 2A, 2B and 2C, an ion having a relatively high energy collides with a target TG in a chamber of a sputter SPT and an atom of the target TG is ejected away from a surface of the target due to the collision. The atom ejected from the target TG is deposited on a substrate ST opposite to the target TG. To obtain the relatively high energy of the ion for sputtering, a plasma of positive and negative ions is formed between the target TG and the substrate ST by ionizing atoms or molecules of a gas. Further, a voltage difference is generated between both sides of the gas in the chamber of the sputter SPT for the plasma generation. For example, a ground voltage may be applied to the substrate or a shield SH for the substrate ST and a voltage different from a ground voltage may be applied to a backing plate BP supporting the target TG.

The sputter may be classified into a direct current (DC) type and an alternating current (AC) type according to the voltage. Specifically, an AC type using an AC voltage having a radio frequency (RF) of about 13.56 MHz, i.e., RF voltage may be referred to as an RF type. Accordingly, a negative DC voltage is applied to the backing plate BP in a DC sputtering of FIG. 2A and an AC voltage having a negative voltage and a positive voltage alternating with each other is applied to the backing plate BP in an AC sputtering of FIG. 2B. In addition, an RF voltage having alternating negative and positive voltages of a radio frequency is applied to the backing plate BP in an RF sputtering of FIG. 2C. Further, a magnet MG of a scan type or a fixing type may be added at a rear surface of the backing plate BP for generation of a magnetic field. The magnetic field increases density of the plasma near the target TG.

Moreover, the sputter may be classified into an in-line type and a cluster type according to method of processing substrates. In an in-line type sputter, the substrates are processed while passing through a series of buffer chambers of a process chamber. Since a plurality of targets is disposed in the process chamber, the in-line type sputter has advantages such that a plurality of materials can be deposited on each substrate. In a cluster type sputter, a transfer chamber transfers substrates to a plurality of process chambers and each substrate is independently processed in each process chamber. Accordingly, the cluster type sputter has advantages in availability of the sputter. Further, since the substrate does not move during a process, a magnet of a scan type is applied to the sputter and utilization of the target TG is improved.

The target TG for an inorganic insulating layer is formed of one of silicon (Si), silicon oxide ($SiO_2$) and silicon nitride ($SiN_x$). The target TG of silicon (Si) may be applied to each of DC, AC and RF type sputters because of its conductive property, while the target TG of silicon oxide ($SiO_2$) or silicon nitride ($SiN_x$) may be applied to any one of AC and RF type sputters.

Table 1 illustrates a process condition for an inorganic insulating layer according to an embodiment of the present invention. Table 1 illustrates a process condition for a silicon nitride (SiNx) layer as an example.

TABLE 1

| Parameter | DC type | AC type | RF type |
|---|---|---|---|
| Target | Si | Si | Si, $SiO_2$, $SiNx$ |
| Frequency | — | 70 KHz | 13.56 MHz |
| Power | 1.5~7 kW | 3~6 kW | 3~6 kW |
| Power density | 2.0 W/cm$^3$ | 5.2 W/cm$^3$ | 0.92 W/cm$^3$ |
| Pressure | 0.4~0.6 Pa | 0.4~0.6 Pa | 0.4~0.6 Pa |
| $N_2$ | 100 sccm | 100 sccm | 100 sccm |
| $H_2$ | 1~50 sccm | 1~50 sccm | — |
| Process temperature | 120° C. | 120° C. | 120° C. |
| Distance between target and substrate | 110~150 cm | 110~150 cm | 110~150 cm |
| Thickness of layer | 300~1000 Å | 300~1000 Å | 300~1000 Å |

The inorganic insulating layer formed by sputtering under the process condition of Table 1 has characteristics similar to an inorganic insulating layer formed by CVD method of a temperature of about 300° C. to about 450° C.

The characteristics of an inorganic insulating layer formed using a target of silicon (Si) doped with one of boron (B) and phosphorus (P) are improved as compared with the characteristics of an inorganic insulating layer formed using a target of intrinsic silicon (Si). When the inorganic insulating layer is formed by an RF sputtering, an impurity concentration of the target is within a range of about 1 ppm to about 999 ppm. In addition, when the inorganic insulating layer is formed by a DC sputtering or an AC sputtering, the impurity concentration for the target is within a range of about 1 ppm to about 200 ppm, and a resistivity of the target is within a range of about 0 ohm·cm to about $10^{-3}$ ohm·cm. Further, a target of silicon oxide ($SiO_2$) or silicon nitride ($SiN_x$) is used for an inorganic insulating layer by an RF sputtering. An inorganic insulating layer by a DC sputtering or an AC sputtering using a target of silicon oxide ($SiO_2$) or silicon nitride ($SiN_x$) has poor characteristics.

A silicon nitride ($SiN_x$) layer by sputtering using a mixed gas of argon (Ar) for collision and nitrogen ($N_2$) and hydrogen ($H_2$) as reaction gases has excellent characteristics in plasma generation, ion acceleration and deposition rate. Although not shown in Table 1, ammonia ($NH_3$) may be used instead of nitrogen ($N_2$) and hydrogen ($H_2$), and a mixed gas of nitrogen ($N_2$), hydrogen ($H_2$), ammonia ($NH_3$) and argon (Ar) may be used for sputtering. For a silicon oxide ($SiO_2$) layer as an inorganic insulating layer, an oxygen ($O_2$) gas may further be added to a mixed gas, and ammonia ($NH_3$) and hydrogen ($H_2$) may be omitted from the mixed gas. A composition ratio, a dielectric constant (or a permittivity) and a refractive index of an inorganic insulating layer such as silicon oxide ($SiO_2$) layer and a silicon nitride ($SiN_x$) layer are controlled by adjusting a mixture ratio of the mixed gas for sputtering.

The plasma generation is controlled with the power, the power density and the pressure of the chamber. The temperature of the chamber and the distance between the target and the substrate are parameters for controlling a deposition rate and characteristics of an inorganic insulating layer on the substrate as well as the plasma generation. For an inorganic insulating layer formed by sputtering, the power of about 1.5 kW to about 30 kW having the power density of about 0.92 W/cm$^3$ to about 2.0 W/cm$^3$ is supplied and the process pressure of the chamber is within a range of about 0.4 Pa to about 1.5 Pa. The process temperature of the chamber is within a range of about 24° C. (room temperature) to about 250° C., and the gap distance between the target and the substrate is within a range of about 110 cm to about 150 cm. In addition, flow rates of argon (Ar), nitrogen ($N_2$) and hydrogen ($H_2$) vary within ranges of about 50 sccm to 1300 sccm, of about 50 sccm to 2000 sccm and of about 1 sccm to 50 sccm, respectively. Further, the frequencies for the AC sputtering and the RF sputtering are about 70 KHz and about 13.56 MHz, respectively.

Figure 3:
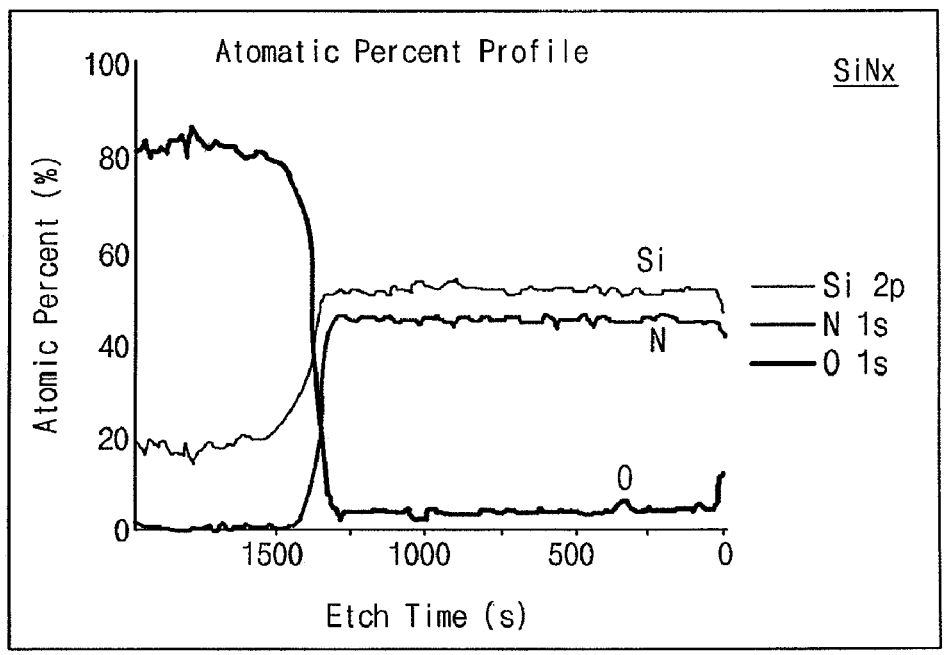
FIG. 3 is an X-ray photoelectron spectroscopy (XPS) graph illustrating an analysis result for an inorganic insulating layer formed by sputtering according to an embodiment of the present invention.

FIG. 3 is an X-ray photoelectron spectroscopy (XPS) graph illustrating an analysis result for an inorganic insulating layer formed by sputtering according to an embodiment of the present invention. FIG. 3 illustrates an analysis result for a silicon nitride ($SiN_x$) layer formed by sputtering under a process condition selected from Table 1.

In an XPS, an X-ray is irradiated onto a sample, and atoms of the sample absorb the X-ray and emit electrons. Since the emitted electrons have a kinetic energy corresponding to difference between an energy of the X-ray and a binding energy of electrons in the sample, the binding energy of electrons in the sample is obtained by measuring the kinetic energy of the emitted electrons. As a result, composition elements of the sample are obtained because the elements have their own specific binding energies. In addition, since the binding energy of electrons varies according to circumstances such as a binding shape with atoms, a chemical binding shape is also obtained.

As shown in FIG. 3, each of silicon (Si) and nitrogen ($N_2$) of the silicon nitride ($SiN_x$) layer has a constant composition ratio within a range of about 40% to about 60%. These results of the silicon nitride ($SiN_x$) layer formed by sputtering are similar to those of a silicon nitride ($SiN_x$) layer formed by a CVD method. In general, when a ratio of nitrogen ($N_2$) to silicon (Si) in a silicon nitride ($SiN_x$) layer is within a range of about 0.7 to about 1.33, the silicon nitride ($SiN_x$) layer has a desirable film property. Since a ratio of nitrogen ($N_2$) to silicon (Si) in the silicon nitride ($SiN_x$) layer formed by sputtering is about 0.9, the silicon nitride ($SiN_x$) layer formed by sputtering has a desirable film property. The ratio of nitrogen ($N_2$) to silicon (Si) in the silicon nitride ($SiN_x$) layer may be controlled by adjusting mixture ratios of argon (Ar) and nitrogen ($N_2$) in the mixed gas.

Figure 4A:
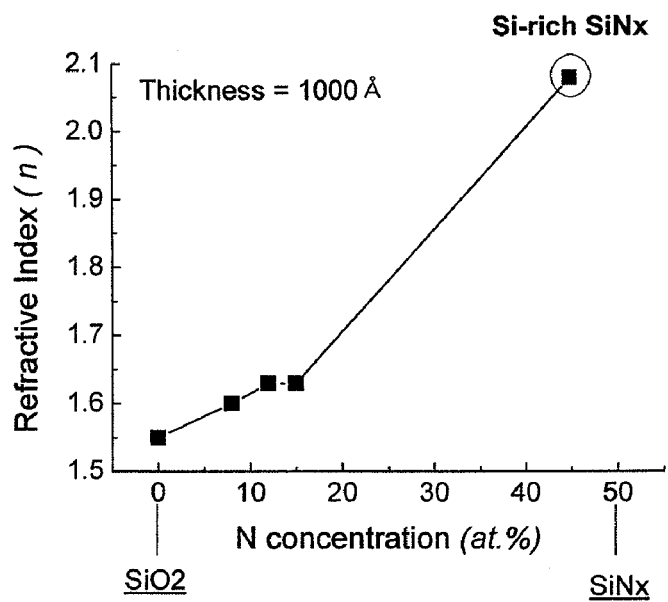
FIGS. 4A, 4B and 4C are graphs illustrating the refractive index, the dielectric constant and the transmittance of an inorganic insulating layer formed by sputtering according to an embodiment of the present invention.
Figure 4B:
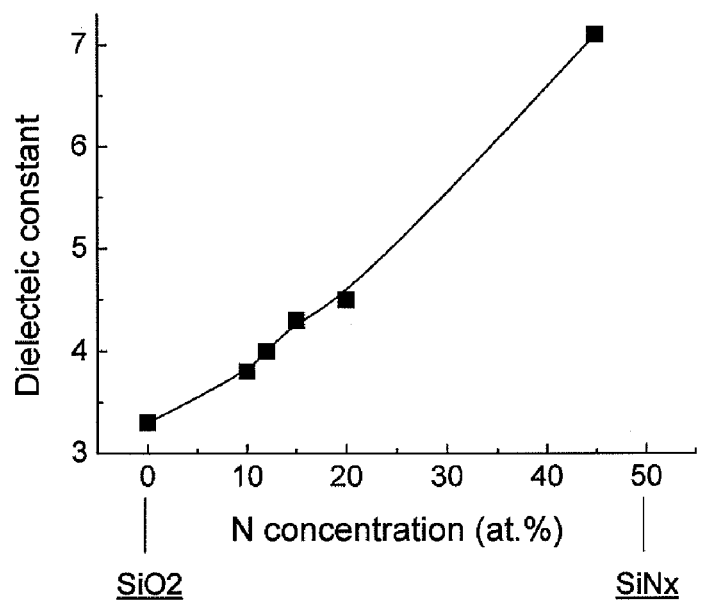
Figure 4C:
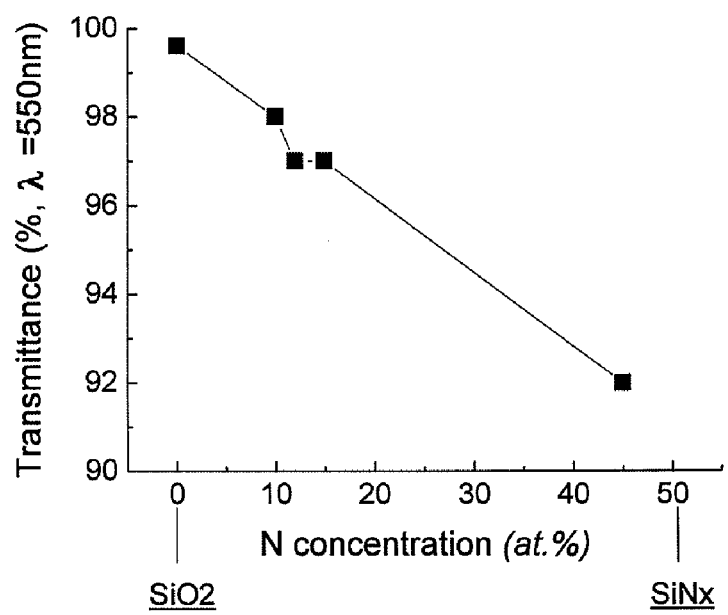
Figure 5A:
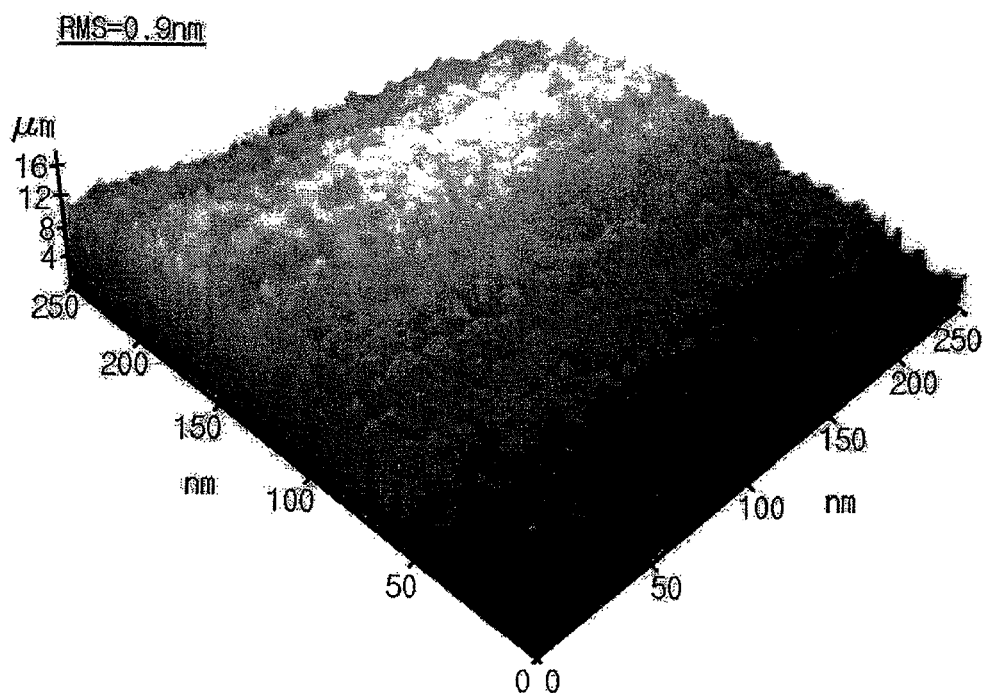
FIGS. 5A, 5B, 5C and 5D are atomic force microscope (AFM) images illustrating the surface states of inorganic insulating layers formed by sputtering under different process conditions according to an embodiment of the present invention.
Figure 5B:
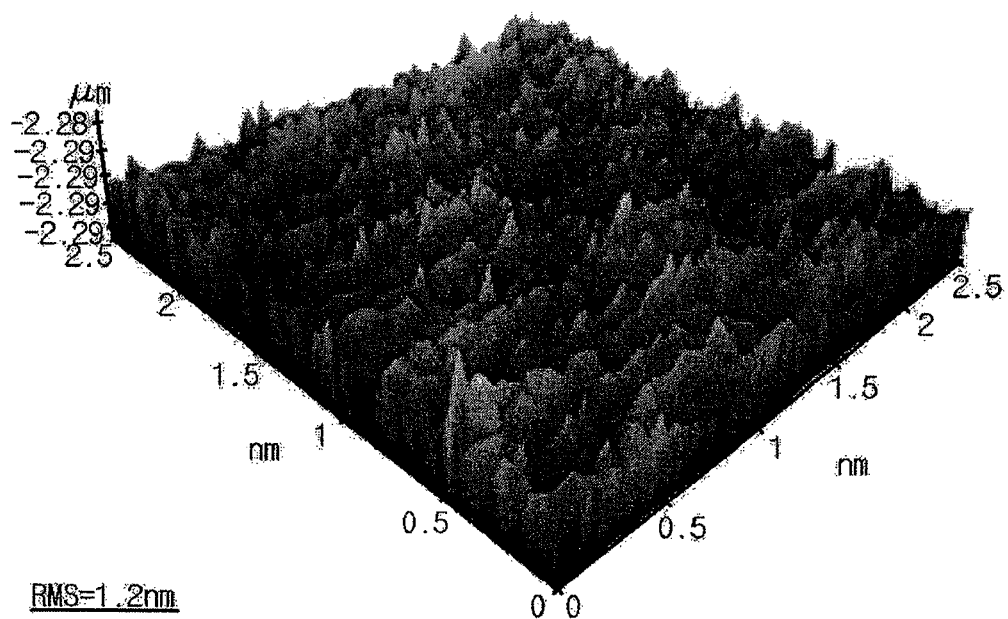
Figure 5C:
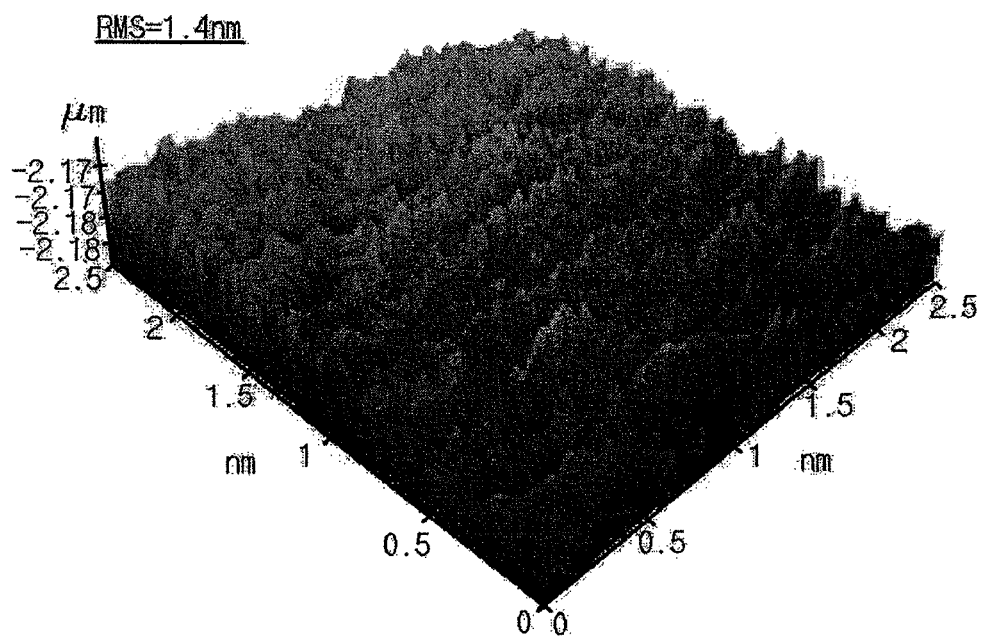
Figure 5D:
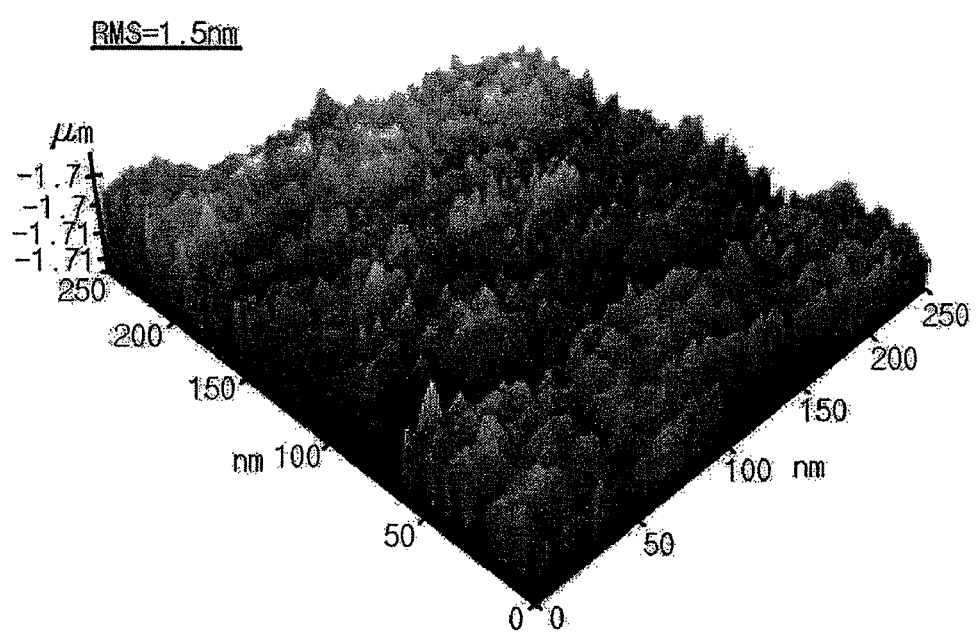
Figure 5C:
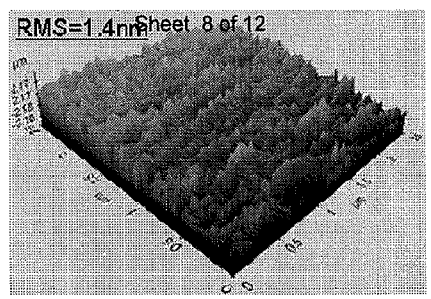
Figure 5D:
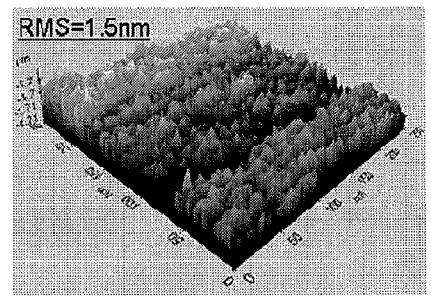

FIGS. 4A, 4B and 4C are graphs illustrating the refractive index, the dielectric constant and the transmittance of an inorganic insulating layer formed by sputtering according to an embodiment of the present invention. In FIGS. 4A, 4B and 4C, the refractive index, the dielectric constant and the transmittance are measured according to a composition ratio of nitrogen ($N_2$) in the inorganic insulating layer having a thickness of about 1000 Å, and specifically, transmittance is measured using light having a wavelength of about 550 nm.

In FIGS. 4A, 4B and 4C, as a composition ratio of nitrogen ($N_2$) in the inorganic insulating layer increases, the refractive index and the dielectric constant of the inorganic insulating layer proportionally increase and the transmittance of the inorganic insulating layer proportionally decreases. Accordingly, characteristics of the inorganic insulating layer can be controlled by adjusting composition ratios of the mixed gas. The composition ratios of the mixed gas can be controlled by adjusting the flow rates of argon (Ar), nitrogen ($N_2$) and oxygen ($O_2$). Specifically, the characteristics of the inorganic insulating layer can be controlled by adjusting the composition ratio of nitrogen ($N_2$) in the inorganic insulating layer.

FIGS. 5A, 5B, 5C and 5D are atomic force microscope (AFM) images illustrating the surface states of inorganic insulating layers formed by DC sputtering under different process conditions according to an embodiment of the present invention.

In FIGS. 5A, 5B, 5C and 5D, a surface roughness of the inorganic insulating layer has a root mean square (RMS) value within a range of about 0.9 nm to about 1.5 nm. Accordingly, the inorganic insulating layer formed by sputtering has a desirable surface roughness throughout the surface thereof.

Figure 6:
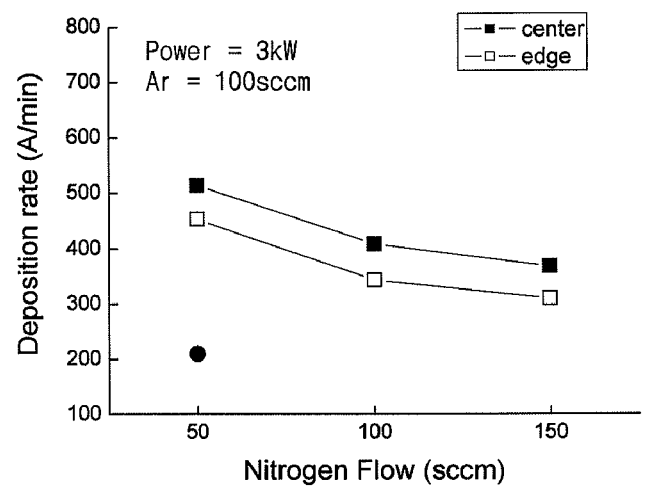
FIG. 6 is a graph illustrating the deposition rate of an inorganic insulating layer formed by sputtering according to an embodiment of the present invention.

FIG. 6 is a graph illustrating a deposition rate of an inorganic insulating layer formed by sputtering according to an embodiment of the present invention. In FIG. 6, the deposition rate is measured according to a flow rate of nitrogen ($N_2$), and a supplied power is about 3 kW and a flow rate of argon (Ar) is about 100 sccm.

As shown in FIG. 6, a deposition rate of the inorganic insulating layer at a center portion of a substrate is greater than a deposition rate of the inorganic insulating layer at an edge portion of the substrate by about 30 Å/min to about 60 Å/min. An inorganic insulating layer formed by a CVD method has the same deposition rate difference as the inorganic insulating layer formed by sputtering, and the deposition rate difference of about 30 Å/min to about 60 Å/min does not cause problems in production of an LCD device. As the flow rate of nitrogen ($N_2$) increases, the deposition rate of the inorganic insulating layer decreases at both the center and edge portions of the substrate with a constant deposition rate difference. When the flow of nitrogen ($N_2$) is about 50 sccm, the inorganic insulating layer has an average deposition rate of about 500 Å/min at the center and edge portions of the substrate. Since an inorganic insulating layer formed by a CVD method has a deposition rate of about 500 Å/min to about 2000 Å/min, the deposition rate of the inorganic insulating layer formed by sputtering is smaller than the deposition rate of the inorganic insulating layer formed by a CVD method. However, since a deposition rate greater than about 300 Å/min is sufficient for mass production of an LCD device, the inorganic insulating layer formed by sputtering can be applied to the production of an LCD device without problems in a deposition rate.

Figure 7:
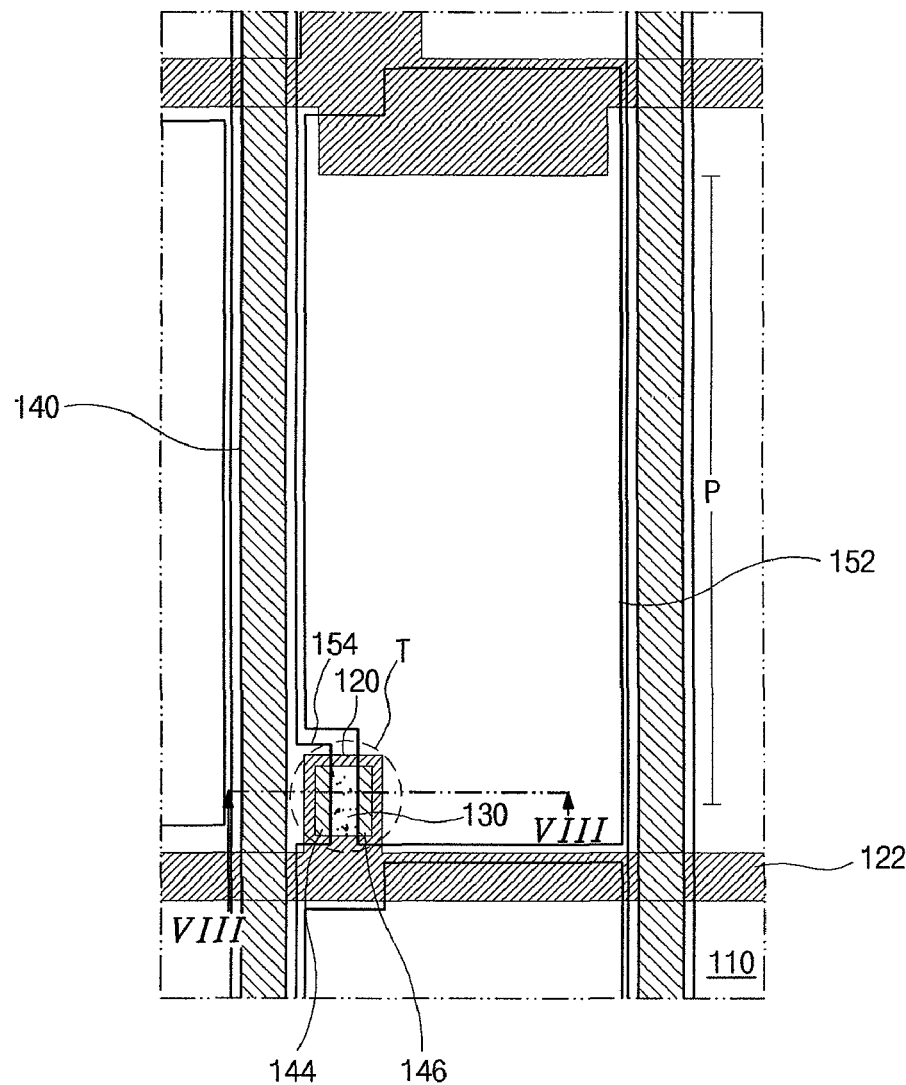
FIG. 7 is a plan view of an array substrate for an LCD device including an inorganic insulating layer formed by sputtering according to an embodiment of the present invention.

FIG. 7 is a plan view of an array substrate for an LCD device including an inorganic insulating layer formed by sputtering according to an embodiment of the present invention. FIGS. 8A to 8E are schematic cross-sectional views illustrating a method of fabricating an array substrate for an LCD device including an inorganic insulating layer formed by sputtering according to an embodiment of the present invention. FIGS. 8A to 8E correspond to cross-sections along the line VIII-VIII of FIG. 7.

Figure 8A:
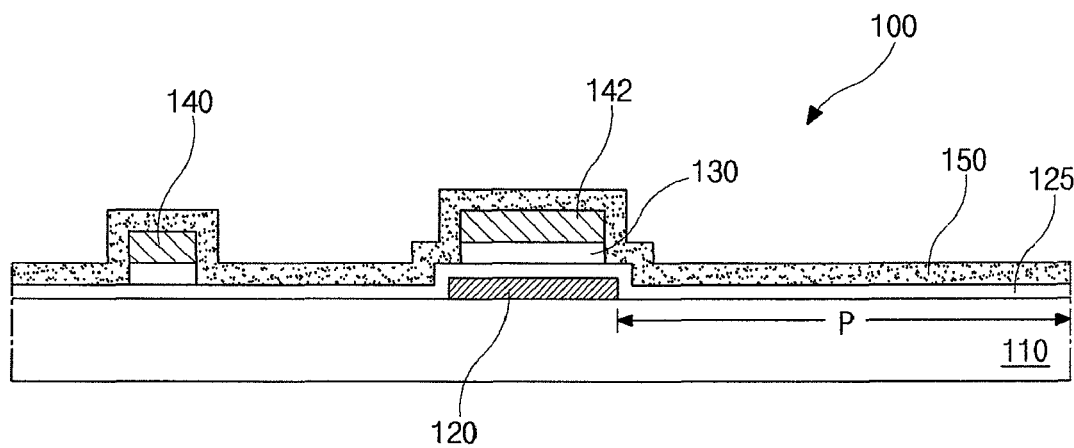
FIGS. 8A to 8E are schematic cross-sectional views illustrating a method of fabricating an array substrate for an LCD device including an inorganic insulating layer formed by sputtering according to an embodiment of the present invention.

In FIGS. 7 and 8A, a gate electrode 120 is formed on a substrate 110 through a first mask process. A gate line 122 connected to the gate electrode 120 is also formed on the substrate 110. After a gate insulating layer 125 is formed on the gate electrode 120 and the gate line 122, an active layer 130, a data line 140, a source electrode 144 and a drain electrode 146 are formed on the gate insulating layer 125 through a second mask process. The data line 140 crosses the gate line 122 to define a pixel region P. The active layer 130 of semiconductor material has an island shape within the gate electrode 120, and the source and drain electrodes 144 and 146 are formed on both sides of the active layer 130 and spaced apart from each other to expose the active layer 130. The exposed active layer 130 may be referred to as a channel region. The gate electrode 120, the active layer 130, the source electrode 144 and the drain electrode 146 constitute a thin film transistor T (TFT). The data line 140 has a double-layered structure of a semiconductor material layer and a conductive material layer. Next, a transparent conductive material layer 150 is formed on a surface of the substrate 110 having the data line 140, the source electrode 144 and the drain electrode 146.

Figure 8B:
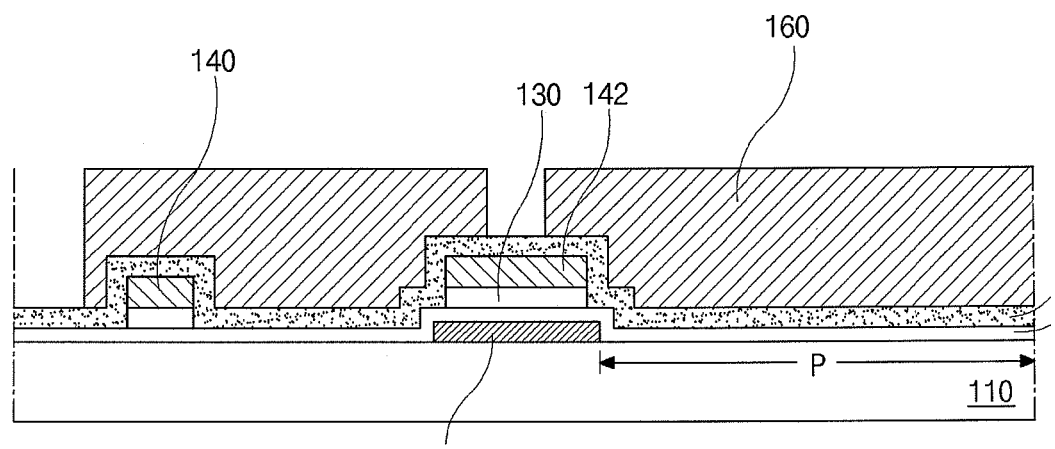

In FIGS. 7 and 8B, a photoresist pattern 160 is formed on the transparent conductive material layer 150 through a third mask process. The photoresist pattern 160 is disposed to correspond to the pixel region P and a portion between the data line 140 and the source electrode 144.

Figure 8C:
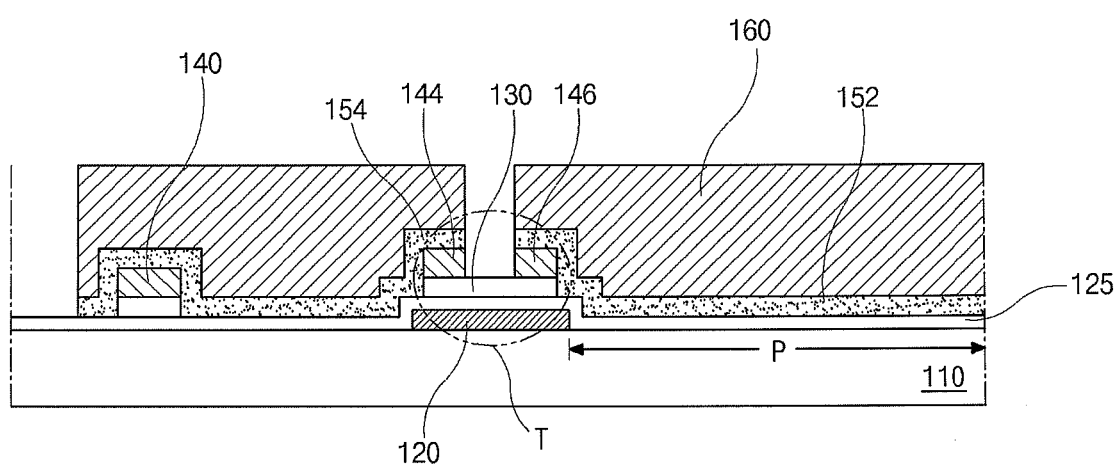

In FIGS. 7 and 8C, the transparent conductive material layer 150 (of FIG. 8B) is patterned using the photoresist pattern 160 as an etch mask to form a pixel electrode 152 contacting the drain electrode 146 in the pixel region P and a connection electrode 154 connecting the data line 140 and the source electrode 144. Accordingly, the transparent conductive material layer 150 on the active layer 130 between the source and drain electrodes 144 and 146 is removed and the active layer 130 between the source and drain electrodes 144 and 146 is exposed. Although the connection electrode 154 completely covers the data line 140 in FIG. 8C, the connection electrode 154 may be formed to partially cover the data line 140 in another embodiment.

Figure 8D:
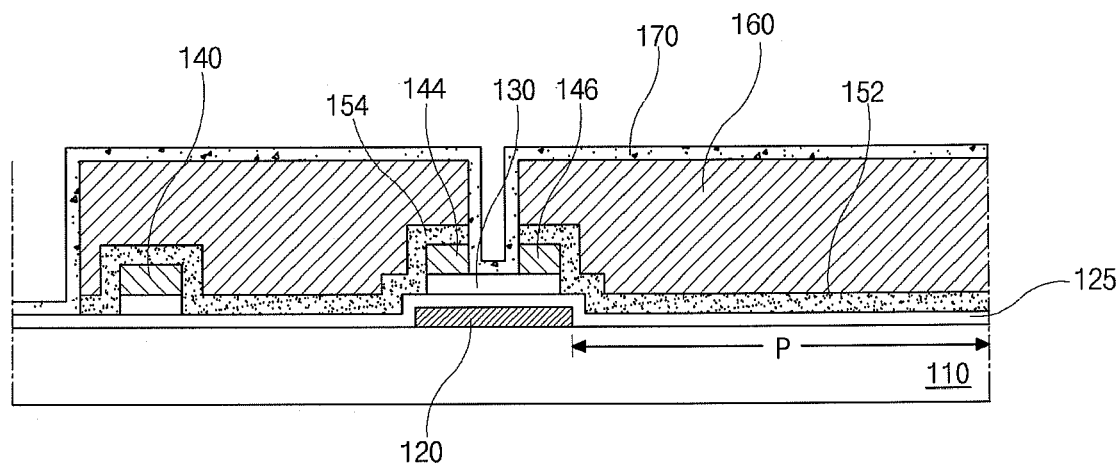

In FIGS. 7 and 8D, a passivation layer 170 of an inorganic insulating material is formed on a surface of the substrate 110 having the photoresist pattern 160 by sputtering. Since the photoresist pattern 160 is formed of resin having a relatively low heat resistance, the photoresist pattern 160 may be deformed or degraded when a passivation layer is formed by a CVD method requiring a temperature process. However, since the passivation layer 170 is formed by sputtering including a process temperature within a range of about 24° C. (room temperature) to about 150° C., the photoresist pattern 160 is not deformed and degraded.

Figure 8E:
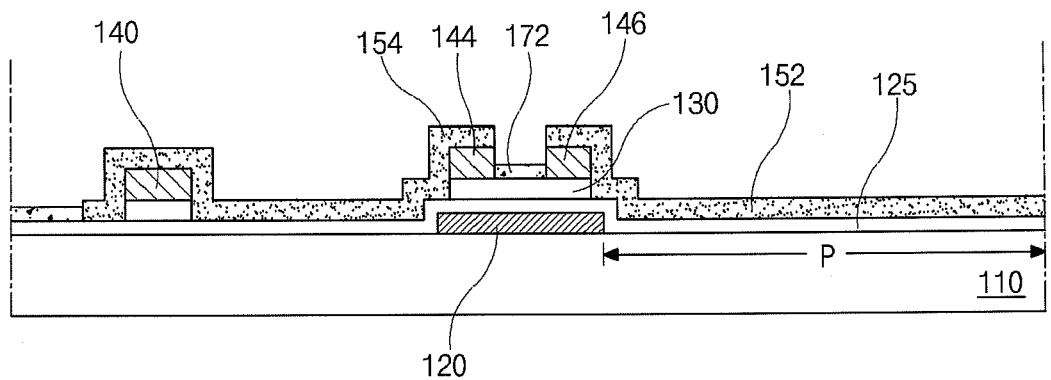

In FIGS. 7 and 8E, the photoresist pattern 160 and the passivation layer 170 on the photoresist pattern 160 are removed using a lift-off method to form a passivation pattern 172 on the active layer 130 exposed between the source and drain electrodes 142 and 144, i.e., the channel region.

In an array substrate, since a passivation pattern is formed of an inorganic insulating layer by sputtering, the array substrate is fabricated through a three-mask process without deterioration in a lift-off process.

Figure 9:
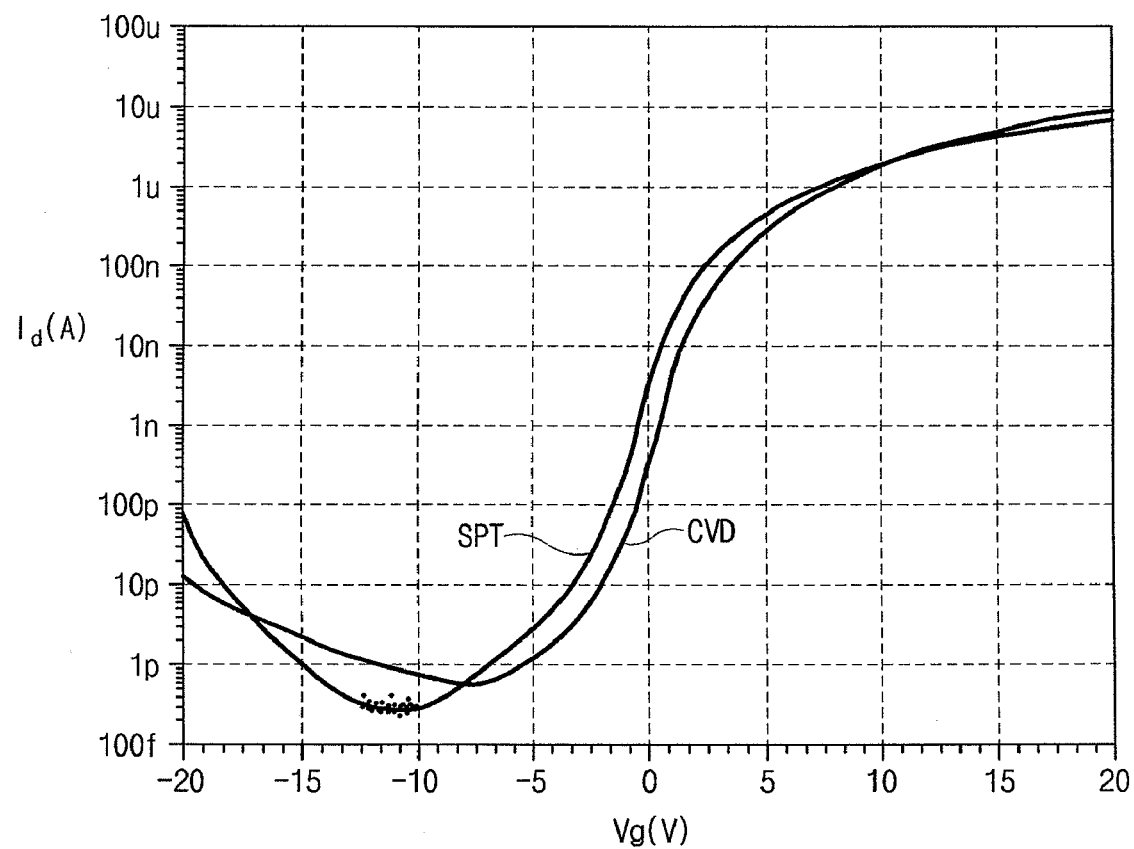
FIG. 9 is a graph illustrating current-voltage (I-V) characteristics of a thin film transistor including an inorganic insulating layer formed by sputtering according to an embodiment of the present invention.

FIG. 9 is a graph illustrating current-voltage (I-V) characteristics of a thin film transistor including an inorganic insulating layer formed by sputtering according to an embodiment of the present invention.

In FIG. 9, a first curve SPT represents an I-V curve of a TFT having an inorganic insulating layer formed by sputtering and a second curve CVD represents an I-V curve of a TFT having an inorganic insulating layer formed by a CVD method. The first curve SPT has a shape similar to the second curve CVD. Specifically, since the first curve SPT has a threshold voltage Vth smaller than the second curve CVD, a driving voltage of a TFT including an inorganic insulating layer formed by sputtering is reduced and a power consumption an LCD device having TFTs each including an inorganic insulating layer formed by sputtering is improved.

Figure 10:
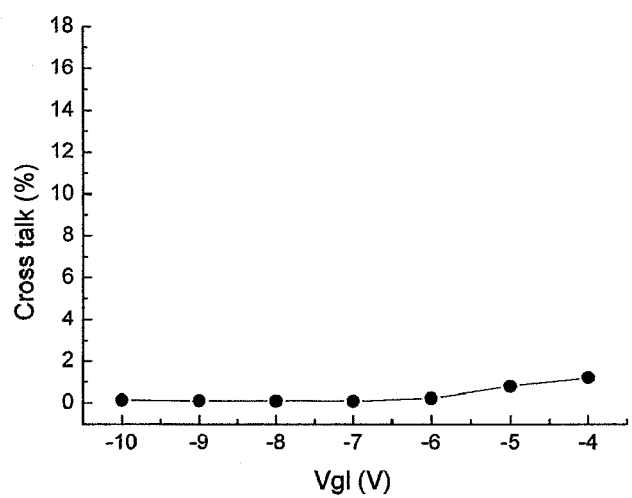
FIG. 10 is a graph illustrating cross talk of an LCD device including an inorganic insulating layer formed by sputtering according to an embodiment of the present invention.

FIG. 10 is a graph illustrating cross talk of an LCD device including an inorganic insulating layer formed by sputtering according to an embodiment of the present invention.

In FIG. 10, occurrence of cross talk in an LCD device is measured with respect to a low gate voltage Vgl applied to a TFT of the LCD device. The occurrence of cross talk in an LCD device including an inorganic insulating layer formed by sputtering is less than about 2% in the range of the gate low voltage Vgl. Accordingly, the occurrence of cross talk of the LCD device including an inorganic insulating layer formed by sputtering is similar to the occurrence of cross talk of the LCD device including an inorganic insulating layer formed by a CVD method that is within a range of about 1% to about 2%.

As a result, the LCD device including an inorganic insulating layer formed by sputtering has properties similar to the LCD device including an inorganic insulating layer formed by a CVD method. Specifically, the LCD device including an inorganic insulating layer formed by sputtering has advantages over the LCD device including an inorganic insulating layer formed by a CVD method in a property such as the threshold voltage.

In addition, since an inorganic insulating layer of the LCD device is formed by sputtering under a temperature within a range of about 24° C. (room temperature) to about 200° C. without property degradation, the substrate of the LCD device can be formed of a flexible material such as plastic having a transition temperature of about 200° C.

Further, an inorganic insulating layer formed by sputtering may be applied to a substrate for a color filter substrate of an LCD device, an organic electroluminescent display (OELD) device and a color filter on thin film transistor (COT) type LCD device.

In a color filter substrate for an LCD device, for example, a black matrix is formed on a substrate, and a color filter layer having red, green and blue color filters is formed in an opening of the black matrix. The color filter layer may be formed of a color resin having a relatively low heat resistance. Further, a common electrode of a transparent conductive material is formed on the black matrix and the color filter layer. Since adhesion between the common electrode and the color filter layer is poor, the common electrode may be peeled off from the color filter layer. The peeling of the common electrode is improved by forming an inorganic insulating layer by sputtering according to one embodiment of the present invention between the common electrode and the color filter layer because the inorganic insulating layer formed by sputtering has good adhesion with the color filter layer and with the common electrode. In addition, since the inorganic insulating layer is formed by sputtering under a temperature within a range of about 24° C. (room temperature) to about 150° C., deformation and degradation of the color filter layer are prevented even when the inorganic insulating layer is formed on the color filter layer.

In an array substrate for a COT type LCD device, a TFT, a pixel electrode and a color filter layer are formed on a single substrate, and the color filter layer is formed over the TFT. When the pixel electrode connected to the TFT is formed on the color filter layer, the pixel electrode of a transparent conductive material may be peeled off from the color filter layer because of poor adhesion between the pixel electrode and the color filter layer. The peeling of the pixel electrode is improved by forming an inorganic insulating layer formed by sputtering according to one embodiment of the present invention between the pixel electrode and the color filter layer because the inorganic insulating layer formed by sputtering has good adhesion with the color filter layer and with the pixel electrode. In addition, since the inorganic insulating layer is formed by sputtering under a temperature within a range of about 24° C. (room temperature) to about 150° C., deformation and degradation of the color filter layer are prevented even when the inorganic insulating layer is formed on the color filter layer.

It will be apparent to those skilled in the art that various modifications and variations can be made in a method of forming an inorganic insulating layer and a method of fabricating a thin film transistor using the inorganic insulating layer without departing from the spirit or scope of the invention. Thus, it is intended that the present invention cover the modifications and variations of this invention provided they come within the scope of the appended claims and their equivalents.

What is claimed is:

1. A method of forming an inorganic insulating layer on a substrate, the method comprising:
   supplying a mixed gas between the substrate and two targets;
   generating a plasma between the substrate and the two targets, wherein the two targets each comprises a silicon-based material, and the two targets are formed of silicon nitride, the two targets each having a front surface facing the substrate and a rear surface opposing the front surface;
   generating a magnetic field return path by having opposite magnetic polarity disposed adjacent to the rear surface of each of the two targets to increase density of the plasma by the two targets; and
   depositing a plurality of ions from the plasma on the substrate,
   wherein the substrate and the two targets are spaced apart from each other by a distance of 110 cm to 150 cm,
   wherein the generating a plasma step comprises supplying an AC power across the two targets, wherein each of the two targets is coupled to a corresponding AC electrode of the AC power, and
   wherein a resistivity of each of the two targets is within a range of about 0 ohm-cm to about $10^3$ ohm·cm.

2. The method according to claim 1, wherein supplying a power is performed under a temperature of about 24 DC to about 250 DC.

3. The method according to claim 2, wherein the power has a power density of about 0.92 W/cm$^3$ to about 5.2 W/cm$^3$.

4. The method according to claim 2, wherein the power is about 1.5 kW to about 30 kW.

5. The method according to claim 1, wherein a pressure of about 0.4 Pa to about 1.5 Pa is applied.

6. The method according to claim 1, wherein each of the two targets is doped with impurities selected from a group consisting of boron and phosphorus.

7. The method according to claim 6, wherein a concentration of the impurities is within a range of about 1 ppm to about 999 ppm.

8. The method according to claim 1, wherein the mixed gas comprises an argon gas and a nitrogen gas.

9. The method according to claim 8, wherein a flow rate of the argon gas is within a range of about 50 sccm to about 1300 sccm and a flow rate of the nitrogen gas is within a range of about 50 sccm to 2000 sccm.

10. The method according to claim 8, wherein the mixed gas further comprises at least one gas selected from a group consisting of an oxygen gas, an ammonia gas and a hydrogen gas.

11. The method according to claim 10, wherein a flow rate of the hydrogen gas is within a range of about 1 sccm to about 50 sccm.

12. The method according to claim 1, wherein the AC power has a frequency of about 70 kHz.

13. The method according to claim 1, wherein the substrate is selected from a group consisting of a glass substrate and a plastic substrate.

14. The method according to claim 8, wherein the mixed gas further comprises an ammonia gas.

* * * * *